(12) United States Patent
Jung

(10) Patent No.: US 7,057,428 B2
(45) Date of Patent: Jun. 6, 2006

(54) CIRCUIT FOR GENERATING PHASE COMPARISON SIGNAL

(75) Inventor: In-Chul Jung, Ichon-shi (KR)

(73) Assignee: Hynix Semiconductor Inc. (KR)

( * ) Notice: Subject to any disclaimer, the term of this patent is extended or adjusted under 35 U.S.C. 154(b) by 0 days.

(21) Appl. No.: 10/746,519

(22) Filed: Dec. 24, 2003

(65) Prior Publication Data

US 2004/0189361 A1 Sep. 30, 2004

(30) Foreign Application Priority Data

Mar. 28, 2003 (KR) ............ 10-2003-0019646

(51) Int. Cl.
*H03L 7/06* (2006.01)
(52) U.S. Cl. ............... 327/149; 327/158
(58) Field of Classification Search ........ 327/149, 327/153, 158, 161, 162, 163; 331/17, 25, 331/DIG. 2; 375/373, 375, 376
See application file for complete search history.

(56) References Cited

U.S. PATENT DOCUMENTS

| 5,537,068 A | * | 7/1996 | Konno | 327/115 |
| 5,764,711 A | * | 6/1998 | Jokura | 375/376 |
| 6,288,583 B1 | * | 9/2001 | Ozawa et al. | 327/113 |

\* cited by examiner

*Primary Examiner*—Linh M. Nguyen
(74) *Attorney, Agent, or Firm*—Blakely Sokoloff Taylor & Zafman

(57) ABSTRACT

A delay locked loop (DLL) circuit in a synchronous dynamic random access memory includes a phase comparison signal generating circuit for generating a phase comparison reference signal by receiving a clock signal, wherein the phase comparison reference signal maintaining a first logic level longer than one period of a clock signal through a clock dividing operation, a delay chain for delaying an inverted phase comparison reference signal in response to a delay chain adjusting signal, a delay model for compensating a delay of a internal circuit by receiving an output signal of the delay chain and a phase comparator for comparing phase of the phase comparison reference signal and an output signal of the delay model.

12 Claims, 7 Drawing Sheets

CIRCUIT FOR GENERATING PHASE COMPARISON SIGNAL

FIELD OF THE INVENTION

The present invention relates to a semiconductor memory device; and, more particularly, to a phase comparison generation circuit in a delay locked loop in the semiconductor memory device.

DESCRIPTION OF RELATED ART

Generally, a delay locked loop (DLL) circuit is employed in a synchronous memory device using a clock signal in order to coincide a phase of an internal clock signal with that of an external clock signal without any errors. When the external clock signal is inputted to be used in an internal circuit, a timing delay of the external signal is caused due to elements configuring the internal circuit such an input buffer and the like. The DLL circuit is used to adjust the timing delay such that the phase of the internal clock signal is matched with that of the external clock signal.

FIG. 1 is a schematic block diagram illustrating a conventional DLL circuit.

As shown, the DLL circuit includes a phase comparison signal generating unit 110, a delay chain 120, a delay model 130 and a phase comparator 140. The phase comparison signal generating unit 110 receives and divides a clock signal CLK and generates a reference signal REF and an inverted reference signal REFB. The delay chain 120 delays the inverted reference signal REFB in response to a delay chain adjusting signal and the delay model 130 compensates a time delay caused by the internal circuit. The phase comparator 140 compares a phases of the reference signal with that of an output signal of the delay model 130, and outputs the delay chain adjusting signal according to a comparison result. The phase comparison signal generating unit 110 includes a plurality of clock dividers 111 to 113, a NAN gate 114 and an inverter 115. The clock dividers 111 to 113 are connected in series and each clock divider sequentially performs a 2 period (T) clock dividing operation by receiving the clock signal CLK. The NAND gate 114 receives divided clock signals from each divider and outputs the reference signal REF, and the inverter 115 receives the reference signal REF and outputs the inverted reference signal REFB.

FIGS. 2A and 2B are timing diagram showing an operation of the conventional DLL circuit.

FIG. 2A is the timing diagram showing an operation of the conventional DLL circuit in case that a period of the clock signal CLK is longer than a delay time of the delay model 130, and FIG. 2B is the timing diagram illustrating an operation of the conventional DLL circuit in case that a period of the clock signal CLK is shorter than a delay time of the delay model 130.

Referring to FIGS. 2A and 2B, the DLL circuit has the minimum clock period (TCK) to be locked due to a delay time of the shortest output path from the clock buffer to the output driver. The conventional DLL circuit employs a $(n-1)^{th}$ clock signal to estimate a position of a $n^{th}$ clock signal and then the $(n-1)^{th}$ clock signal is delayed, so that to the internal clock signal generated by delaying the $(n-1)^{th}$ clock signal has the same phase with the $n^{th}$ clock signal.

As shown in FIG. 2B, when a delay time of the clock signal passing the shortest output path is longer than a clock period TCK of the clock signal, there is a problem that it is possible to purse the external clock signal. That is to say again, since the DLL circuit purses a next external clock signal by adding delay time of the delay chain capable having a variable delay and the delay model corresponding to the shortest output path of the clock signal, if the delay time of the shortest output is longer than the clock period TCK of the clock signal, even if the delay time of the delay chain is 0, the next external clock signal can not be pursed because there is no delay to be decreased.

SUMMARY OF THE INVENTION

It is, therefore, an object of the present invention to provide a phase comparison signal generating circuit in a delay locked loop (DLL) to be applied regardless of a frequency of a clock signal.

In accordance with an aspect of the present invention, there is provided a circuit for generating a phase comparison signal in a delay locked loop (DLL) circuit, including: a phase comparison signal generating circuit for generating a phase comparison reference signal maintaining a first logic level longer than one period of a clock signal through a clock dividing operation.

In accordance with another aspect of the present invention, there is provided a delay locked loop (DLL) circuit in a synchronous dynamic random access memory, including: a phase comparison signal generating circuit for generating a phase comparison reference signal by receiving a clock signal, wherein the phase comparison reference signal maintaining a first logic level longer than one period of a clock signal through a clock dividing operation; a delay chain for delaying an inverted phase comparison reference signal in response to a delay chain adjusting signal; a delay model for compensating a delay of a internal circuit by receiving an output signal of the delay chain; and a phase comparator for comparing phase of the phase comparison reference signal and an output signal of the delay model.

BRIEF DESCRIPTION OF THE DRAWINGS

The above and other objects and features of the instant invention will become apparent from the following description of preferred embodiments taken in conjunction with the accompanying drawings, in which.

DETAILED DESCRIPTION OF THE INVENTION

Hereinafter, a delay locked loop (DLL) circuit in a semiconductor memory device according to the present invention will be described in detail referring to the accompanying drawings.

Figure 1:
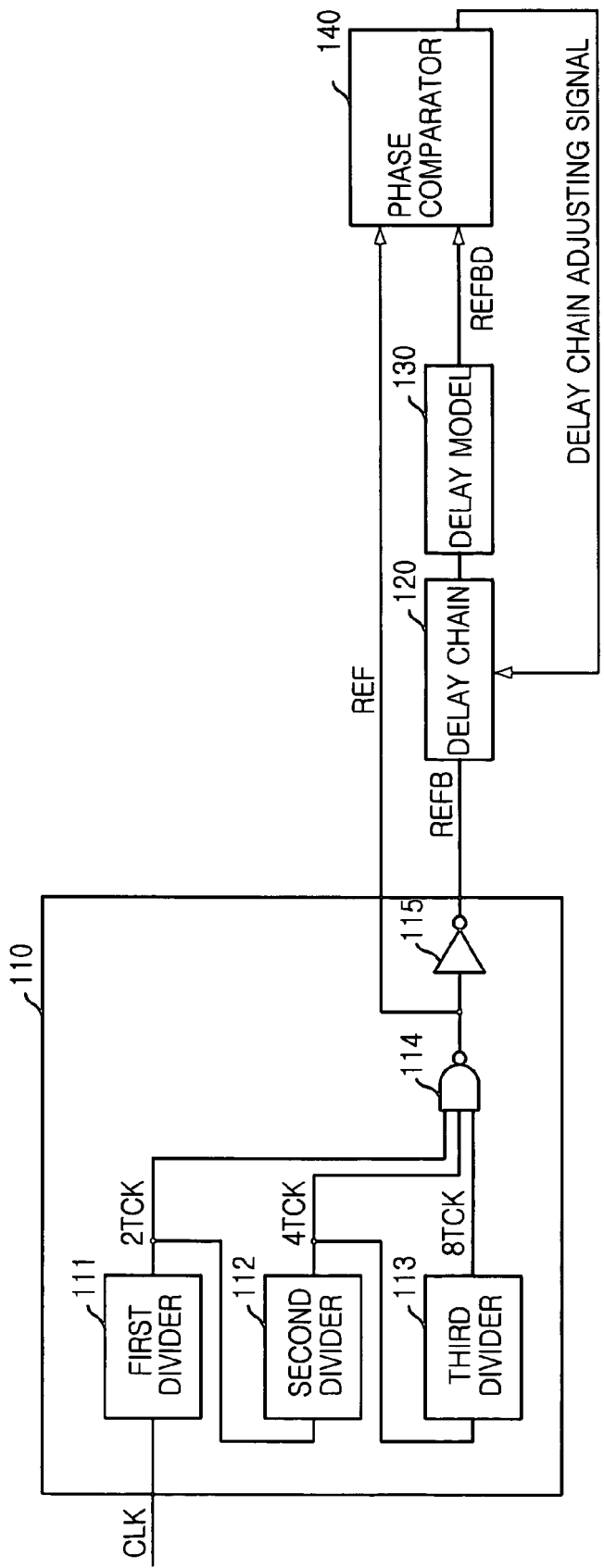
FIG. 1 is a schematic block diagram illustrating a conventional DLL circuit.
Figure 2A:
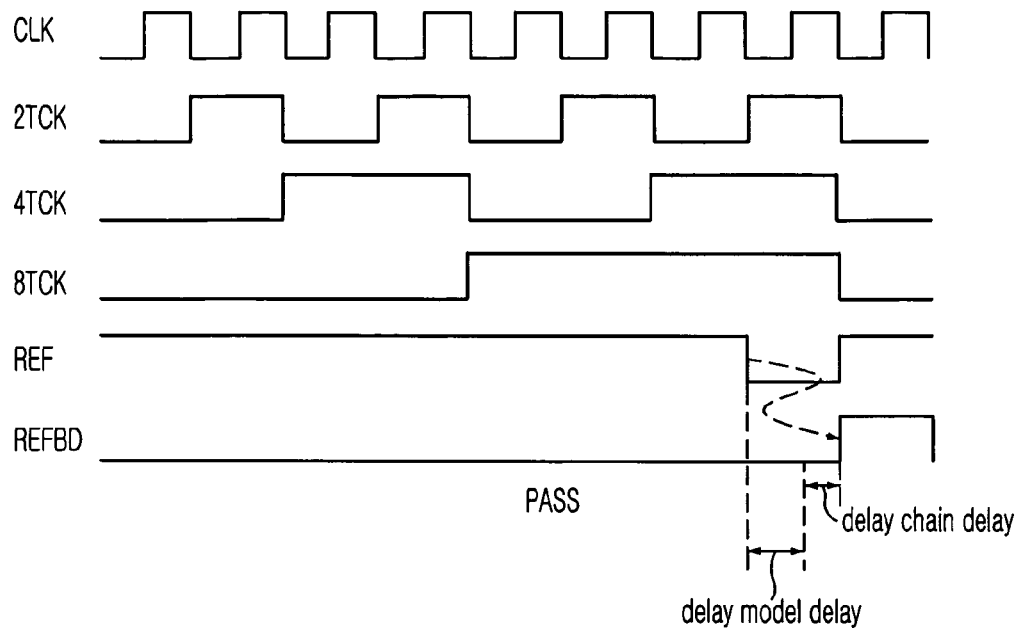
FIGS. 2A and 2B are timing diagram showing an operation of the conventional DLL circuit.
Figure 2B:
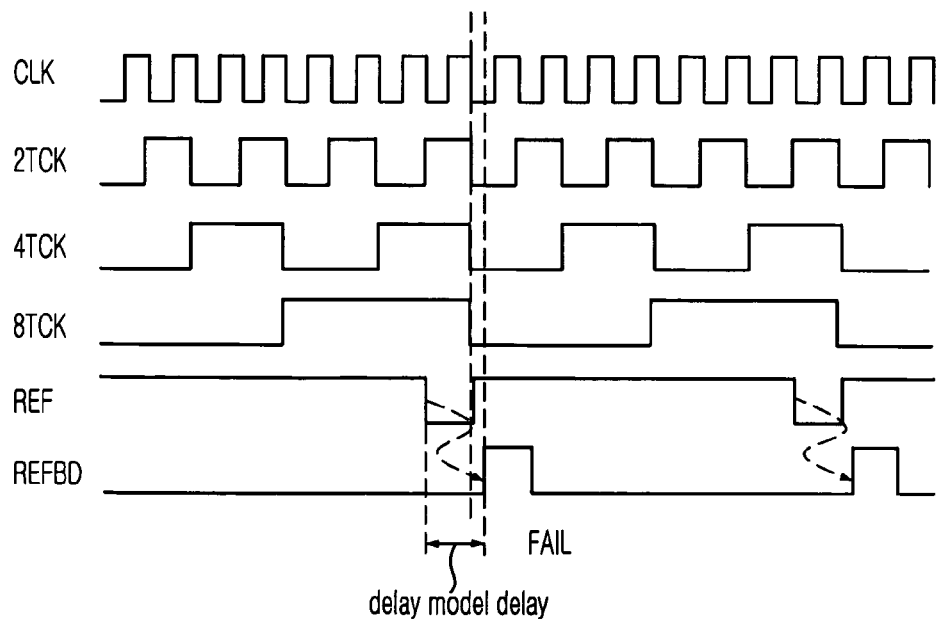
Figure 3:
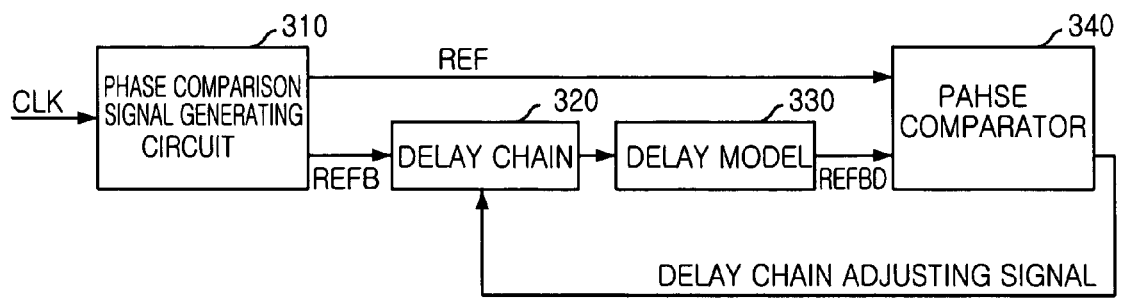
FIG. 3 is a block diagram illustrating a delay lock loop DLL circuit having a phase comparison signal generating circuit in accordance with the present invention.

FIG. 3 is a block diagram illustrating a delay lock loop DLL circuit having a phase comparison signal generating circuit in accordance with the present invention.

The DLL circuit includes a phase comparison signal generating circuit 310, a delay chain 320, delay model 330 and a phase comparator 340. The phase comparison generating circuit 310 generates a phase comparison reference signal REF maintain a first logic level longer than a clock period of a clock signal CLK and an inverted phase comparison reference signal REFB. The phase comparison reference signal REF is inputted into the phase comparator 340 and the inverted phase comparison reference signal REFB is inputted into the delay chain 320. The delay chain 320 delays the inverted phase comparison reference signal in response to a delay chain adjusting signal and the delayed signal is inputted to the delay model 330.

The delay model 330 receives an output signal of the delay chain and outputs a compensation signal REFB by compensating a delay time of an internal circuit into the phase comparator 340. The phase comparator 340 receives and compares the phase comparison reference signal REF and the compensation signal REFBD outputted from the delay model 330, and generates the delay chain adjusting signal according to a comparison result. The delay chain adjusting signal is inputted to the delay chain 320.

Figure 4:
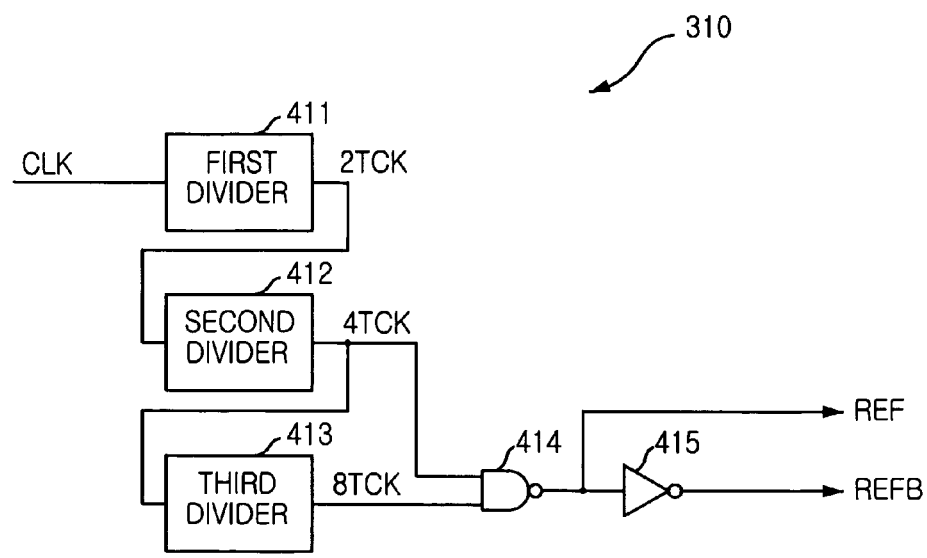
FIG. 4 is a block diagram illustrating the phase comparison signal generating circuit in FIG. 3.

FIG. 4 is a block diagram illustrating the phase comparison signal generating circuit 310 in FIG. 3.

The phase comparison signal generating circuit 310 includes first, second and third dividers 411, 412 and 413, a first NAND gate 414 and a first inverter 415. The first divider 411 receives the clock signal CLK and generates a first divided clock signal 2TCK having a 2TCK clock period, wherein TCK represents one period of the clock signal CLK. The first divider performs a 2T-clock dividing operation, wherein T represents a period.

The second divider 412 receives the first divided clock signal 2TCK from the first divider 411 and generates a second divided clock signal 4TCK having 4TCK clock period. The third divider 413 receives the second divided clock signal 4TCK and generates a third divided clock signal 8TCk having 8TCK clock period. The second and third dividers are configured with the 2T-clock divider.

The first NAND gate 414 receives the second and third divided clock signals 4TCK and 8TCK and generates the phase comparison reference signal REF by logically combining the input signals. The first inverter 415 receives and inverts the phase comparison reference signal REF and generates the inverted phase comparison reference signal REFB.

Figure 5:
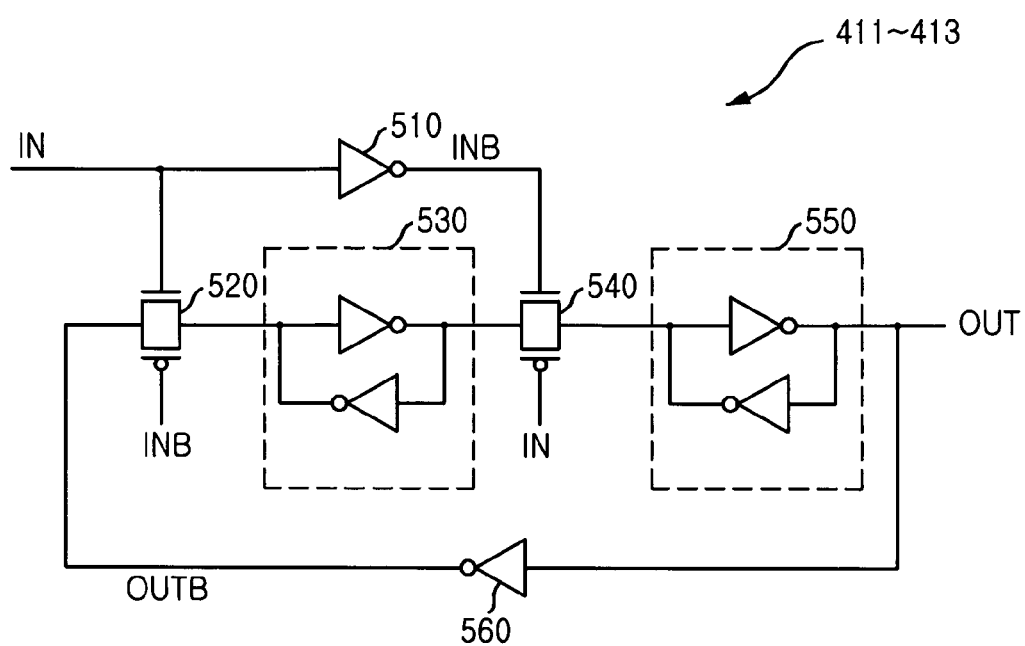
FIG. 5 is a circuit diagram illustrating a divider in the phase comparison signal generating circuit in accordance with the present invention.

FIG. 5 is a circuit diagram illustrating one of first to third dividers 411 to 413 in the phase comparison signal generating circuit 310 in accordance with the present invention.

The divider includes a first inverter 510, a first pass gate 520, a first latch 530, a second pass gate 540, a second latch 550 and a second inverter 560. The first inverter 520 receives an input signal IN and outputs an inverted input signal INB, and the first pass gate 520 passes an inverted output signal of the divider to the first latch when the input signal is a logic high level. The first latch 530 latches an signal passing the first pass gate 520, and the second pass gate 540 passes an output signal of the first latch 530 when the input signal IN is a logic low level. The second latch 550 outputs the output signal OUT after latching a signal passing the second pass gate 540. The second inverter 560 receives the output signal OUT and outputs the inverted output signal OUTB.

Figure 6A:
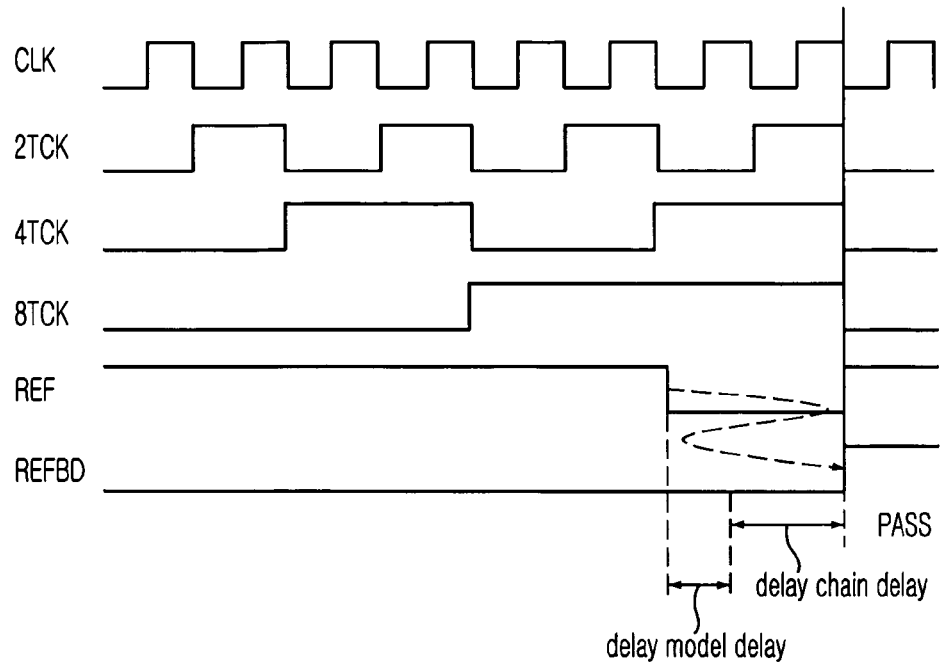
FIGS. 6A and 6B are timing diagrams showing an operation of the DLL circuit in accordance with the present invention.
Figure 6B:
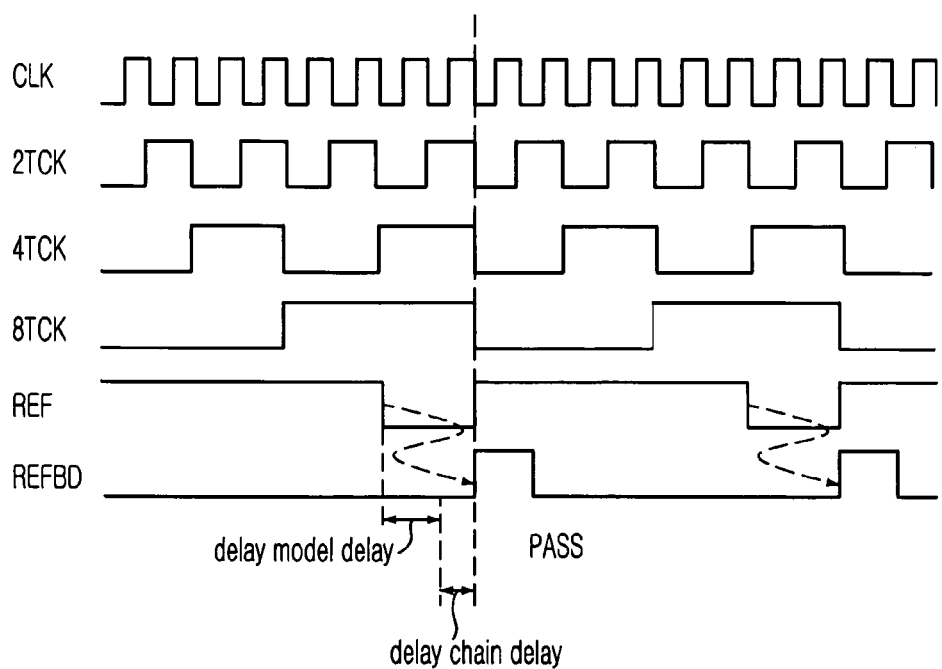

FIGS. 6A and 6B are timing diagrams showing an operation of the DLL circuit in accordance with the present invention.

FIG. 6A is the timing diagram showing an operation of the DLL circuit when the clock period TCK of the clock signal CLK is longer than the delay of the delay model, and FIG. 6B is the timing diagram showing an operation of the DLL circuit when the clock period TCK of the clock signal CLK is shorter than the delay of the delay model.

Referring to FIGS. 6A and 6B, the reference signal REF is generated by logically combining the 4T-divided clock signal 4TCK and the 8T-divided clock signal 8TCK. Therefore, the reference signal REF maintains a logic low level for 2 TCK, and the inverted reference signal REF maintains a logic high level for 2 TCKs. Namely, the internal clock signal is synchronized with not a 1T previous clock signal but a 2T previous clock signal. Accordingly, even if the clock period TCK is shorter than the delay of the delay model, the internal clock signal can be synchronized with the external clock signal.

Figure 7:
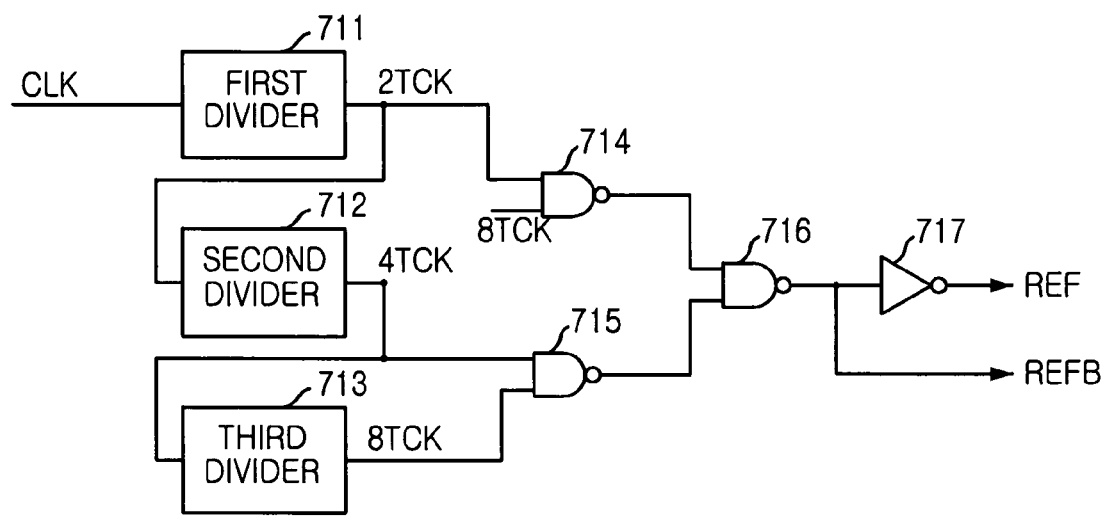
FIG. 7 is a block diagram illustrating a phase comparison signal generating circuit in accordance with another embodiment of the present invention.

FIG. 7 is a block diagram illustrating a phase comparison signal generating circuit in accordance with another embodiment of the present invention.

As shown, the phase comparison signal generating circuit includes a plurality of dividers 711, 712 and 713, a plurality of NAND gates 714, 715 and 716, and an inverter 717. The first divider 711 receives a clock signal CLK and outputs a 2T-divided clock signal 2TCK, and the second divider 712 receives the 2T-divided clock signal 2TCK and outputs 4T-divided clock signal 4TCK. The third divider 713 receives the 4T-divided clock signal 4TCK and outputs an 8T-divided clock signal 8TCK. The dividers 711, 712 and 713 are configured with the divider illustrated in FIG. 5.

The first NAND gate 714 receives the 2T-divided clock signal 2TCK and the 8T-divided clock signal 8TCK and the second NAND gate 715 receives the 4T-divided clock signal 4TCK and the 8T-divided clock signal. The third NAND gate 716 outputs an inverted reference signal by logically combining the output signals of the first and second NAND gates 714 and 715. The first inverter 717 outputs a reference signal by receiving an output signal of the third NAND gate 716.

Figure 8A:
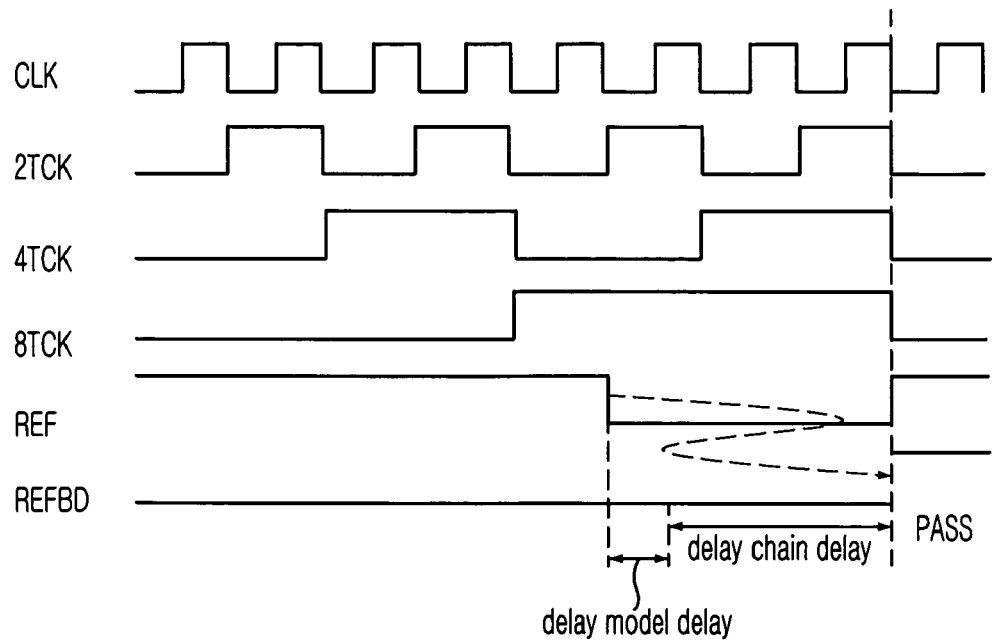
FIGS. 8A to 8B are timing diagrams showing an operation of the DLL circuit in accordance with the present invention.
Figure 8B:
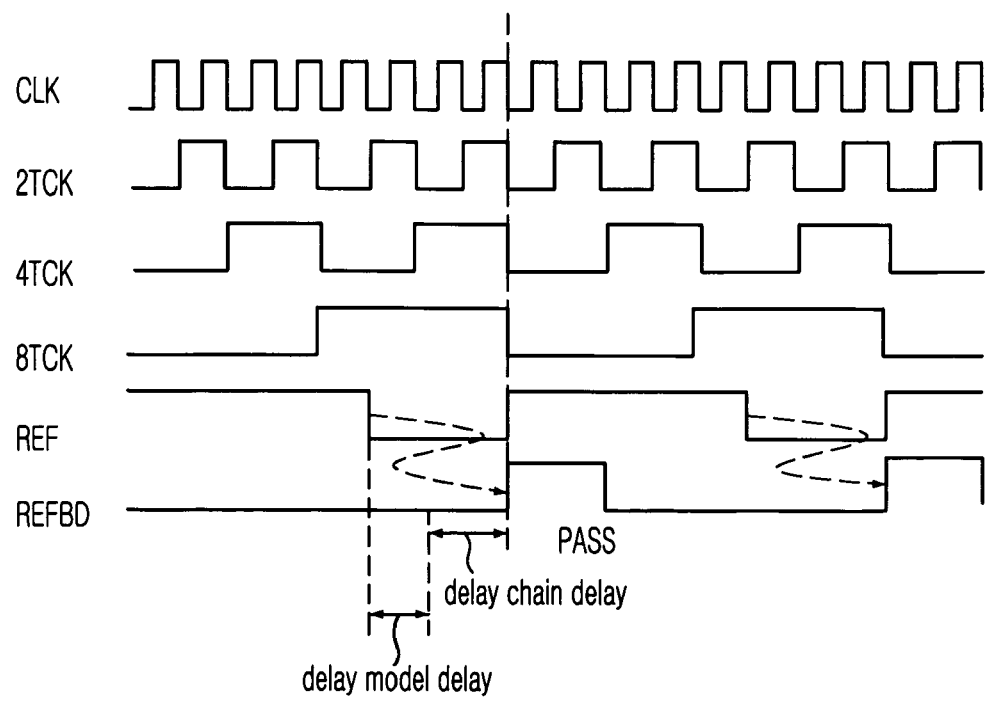

FIGS. 8A to 8B are timing diagrams showing an operation of the DLL circuit in accordance with the present invention.

FIG. 8A is the timing diagram showing an operation of the DLL circuit when the clock period TCK of the clock signal CLK is longer than the delay of the delay model, and FIG. 8B is the timing diagram showing an operation of the DLL circuit when the clock period TCK of the clock signal CLK is shorter than the delay of the delay model.

As shown, the reference signal REF maintains a logic low level for 3 TCKS, and the inverted reference signal REF maintains a logic high level for 3 TCKs. Namely, the internal clock signal is synchronized with not a 1T previous clock signal but a 3T previous clock signal. Accordingly, even if the clock period TCK is shorter than the delay of the delay model, the internal clock signal can be synchronized with the external clock signal.

In accordance with the present invention, since the at least 2T previous external clock signal is delayed in order that the internal clock signal is synchronized with the external clock signal, even if one period of the external clock signal is shorter than the delay of the shortest output path in the internal circuit, the internal clock signal can be synchronized with the external clock signal.

While the present invention has been described with respect to the particular embodiments, it will be apparent to those skilled in the art that various changes and modifications may be made without departing from the spirit and scope of the invention as defined in the following claims.

What is claimed is:

1. A circuit for generating a phase comparison reference signal, comprising:
   a clock dividing unit for dividing a clock signal to thereby generate a plurality of divided signals; and
   a logic unit for performing a logic operation to at least two of the plurality of divided signals to thereby generate the phase comparison reference signal,
   wherein a logic low level period of the phase comparison reference signal is longer than twice cycle of the clock signal,
   wherein an activation enable period length of the phase comparison reference signal within one cycle of the phase comparison reference signal is longer than one cycle of the clock signal.

2. The circuit as recited in claim 1, wherein the clock dividing unit includes:
   a first divider for dividing the clock signal by a predetermined number to thereby generate a first divided signal;
   a second divider for dividing the first divided signal by the predetermined number to thereby generate a second divided signal; and a third divider for dividing the second divided signal by the predetermined number to thereby generate a third divided signal.

3. The circuit as recited in claim 2, wherein the predetermined number is 2.

4. The circuit as recited in claim 2, wherein the logic unit included:
   a first NAND gate for performing a logic NAND operation to the first divided signal and the third divided signal;
   a second NAND gate for performing logic NAND operation to the second divided signal and the third divided signal;
   a third NAND gate for performing a logic NAND operation to an output of the first NAND gate and an output of the second NAND gate to thereby generate an inverted phase comparison reference signal; and
   an inverter for inverting the inverted phase comparison reference signal to thereby generate the phase comparison reference signal.

5. A delay locked loop (DLL) circuit for use in a synchronous dynamic random access memory, comprising:
   a phase comparison signal generating circuit for generating a phase comparison reference signal and an inverted phase comparison reference signal by dividing a clock signal, wherein a logic low level period of the phase comparison reference signal is longer than twice cycle of the clock signal;
   a delay chain for delaying the inverted phase comparison reference signal in response to a delay chain adjusting signal;
   a delay model for compensating a delay of an internal circuit by delaying an output signal of the delay chain for a predetermined time; and
   a phase comparator for comparing a phase of the phase comparison reference signal and a phase of an output signal of the delay model to thereby generate the delay chain adjusting signal.

6. The DLL circuit as recited in claim 5, wherein the phase comparison reference signal generating circuit includes:
   a clock dividing unit for dividing the clock signal to thereby generate a plurality of divided signals; and
   a logic unit for performing a logic operation to at least two of the plurality of divided signals to thereby generate the phase comparison reference signal.

7. The DLL circuit as recited in claim 6, wherein the clock dividing unit includes:
   a first divider for dividing the clock signal by a predetermined number to thereby generate a first divided signal;
   a second divider for dividing the first divided signal by the predetermined number to thereby generate a second divided signal; and
   a third divider for dividing the second divided signal by the predetermined number to thereby generate a third divided signal.

8. The DLL circuit as recited in claim 7, wherein the predetermined number is 2.

9. The DLL circuit as recited in claim 8, wherein the logic unit includes:
   a NAND gate for performing a logic NAND operation to the second divided signal and the third divided signal to thereby generate the phase comparison reference signal; and
   an inverter for inverting the phase comparison reference signal to thereby generate the inverted phase comparison reference signal.

10. The DLL circuit as recited in claim 7, wherein the logic unit includes:
    a first NAND gate for performing a logic NAND operation to the first divided signal and the third divided signal:
    a second NAND gate for performing a logic NAND operation to the second divided signal and the third divided signal:
    a third NAND gate for performing a logic NAND operation to an output of the first NAND gate and an output of the second NAND gate to thereby generate the inverted phase comparison reference signal; and
    an inverter for inverting the inverted phase comparison reference signal to thereby generate the phase comparison reference signal.

11. The circuit as recited by claim 2, wherein the logic unit includes a NAND gate for performing a logic NAND operation to the second divided signal and the third divided signal to thereby generate the phase comparison reference signal.

12. The circuit as recited in claim 11, wherein the logic unit further includes an inverter for inverting the phase comparison reference signal to thereby generate an inverted phase comparison reference signal.

* * * * *